United States Patent [19]
Houston

[11] Patent Number: 5,498,882
[45] Date of Patent: Mar. 12, 1996

[54] EFFICIENT CONTROL OF THE BODY VOLTAGE OF A FIELD EFFECT TRANSISTOR

[75] Inventor: Theodore W. Houston, Richardson, Tex.

[73] Assignee: Texas Instruments Incorporated, Dallas, Tex.

[21] Appl. No.: 376,465

[22] Filed: Jan. 20, 1995

Related U.S. Application Data

[63] Continuation of Ser. No. 213,789, Mar. 16, 1994, abandoned.

[51] Int. Cl.$^6$ .................. H01L 29/04; H01L 31/036; H01L 31/0376; H01L 31/20
[52] U.S. Cl. .................. 257/57; 257/347; 257/372
[58] Field of Search .................. 307/298, 303.2, 307/296.2; 257/57, 347, 339, 372, 394, 401

[56] References Cited

U.S. PATENT DOCUMENTS 4,675,561  6/1987  Bowers .................. 307/303.2
5,095,348  3/1992  Hansen .................. 307/303.2

FOREIGN PATENT DOCUMENTS 57-27068   2/1982  Japan .................. 257/347
60-130855  7/1985  Japan .................. 257/401
1206668    8/1989  Japan .................. 257/401

*Primary Examiner*—Stephen D. Meier
*Attorney, Agent, or Firm*—Jacqueline J. Garner; Richard L. Donaldson; William E. Hiller

[57]  ABSTRACT

Efficient control of the body voltage embodiment, the body node of a first field effect transistor is connected to the gate of the first transistor through a second field effect transistor. In another embodiment, the body node (p−) of a first transistor is connected to a drain (3) of the first transistor through a second transistor in an area efficient manner. The first and second transistors have a common drain (3) and the gate of the second transistor is an extension of the gate (G) of the first transistor.

12 Claims, 2 Drawing Sheets

5,498,882

EFFICIENT CONTROL OF THE BODY VOLTAGE OF A FIELD EFFECT TRANSISTOR

This application is a Continuation of application Ser. No. 08/213,789, filed Mar. 16, 1994, now abandoned.

FIELD OF THE INVENTION

The invention relates generally to semiconductor devices and more specifically to efficient control of the body voltage of a field effect transistor.

BACKGROUND OF THE INVENTION

Low power devices that are capable of delivering a large amount of current would be highly desirable for future and existing technologies. For a field effect transistor fabricated as an integrated circuit device on a semiconductor substrate, a parasitic bipolar transistor inherently exists in the semiconductor substrate. FIG. 1 is a schematic drawing which illustrates field effect transistor 2 and its parasitic bipolar transistor 4. The collector and emitter of bipolar transistor 4 are connected to a respective drain/source of field effect transistor 2. In a field effect transistor, the body potential is one parameter in deter-raining the threshold voltage. This is known as the body effect. Thus the drive current and leakage current are influenced by the body potential. In the past, schemes have been proposed to take advantage of the parasitic bipolar transistor and/or the body effect, including connecting the gate of the field effect transistor to the base of the parasitic bipolar transistor, and connecting the drain of the field effect transistor to the base of the parasitic bipolar transistor through a separate field effect transistor. It would be particularly beneficial if the gate of the field effect transistor could be connected to the base of the parasitic bipolar transistor in such a way that there would not be persistent gate current, and if the drain of the field effect transistor could be connected to the base of the parasitic bipolar transistor through a separate field effect transistor in an area efficient manner.

SUMMARY OF THE INVENTION

Efficient control of the body voltage of a field effect transistor is disclosed herein. In one embodiment, the body node of a first field effect transistor is connected to the gate of the first transistor through a second field effect transistor. In another embodiment, the body node (p–) of a first transistor is connected to a drain (3) of the first transistor through a second transistor in an area efficient manner. The first and second transistors have a common drain (3) and the gate of the second transistor is an extension of the gate (G) of the first transistor. If desired, the body node (p–) of the first transistor may also be connected to a selected potential directly or through a third transistor in order to keep the body node from floating when the gate (G) is at a logic low potential.

An advantage of the invention is providing efficient control of the body voltage of a field effect transistor.

A further advantage of the invention is providing efficient control of the body voltage of a field effect transistor in an area efficient manner.

These and other advantages will be apparent to those skilled in the art having reference to the specification in conjunction with the drawings.

BRIEF DESCRIPTION OF THE DRAWINGS

FIG. 5, which is a modification of the layout of FIG. 3, illustrates a top view of the layout of the circuit shown in FIG. 4a.

DETAILED DESCRIPTION OF THE INVENTION

The invention provides enhanced transistor performance and efficiency over conventional transistors.

Figure 1:
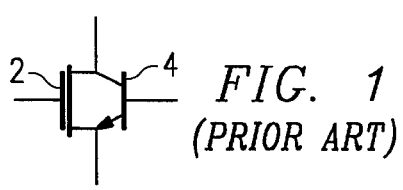
FIG. 1 is a schematic drawing which illustrates prior art field effect transistor and its parasitic bipolar transistor.
Figure 2:
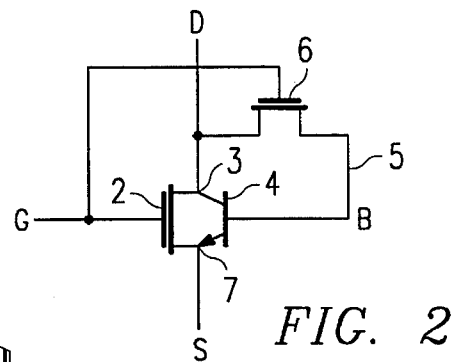
FIG. 2 is a schematic drawing of a first preferred embodiment of the invention.

A first preferred embodiment of the invention is shown in FIG. 2. The performance and efficiency of the transistor action associated with field effect transistor 2 is enhanced by the use of bipolar parasitic transistor 4 connected at its collector and emitter to respective drain/sources of transistor 2. For the circuit shown in FIG. 2, the collector of bipolar transistor 4 is connected to the drain of transistor (at reference numeral 3). The drain of transistor 2 is then connected to a drain voltage (label D). Further, for the circuit of FIG. 2, the emitter of bipolar transistor is connected to the source of transistor 2 (at reference numeral 7) which is connected to source voltage (label S). A drain/source of field effect transistor 6 is connected to the base of transistor 4 while the other drain/source of field effect transistor 6 is connected to the drain of field effect transistor 2. The gates of transistors 2 and 6 are connected together and labeled G.

Figure 3:
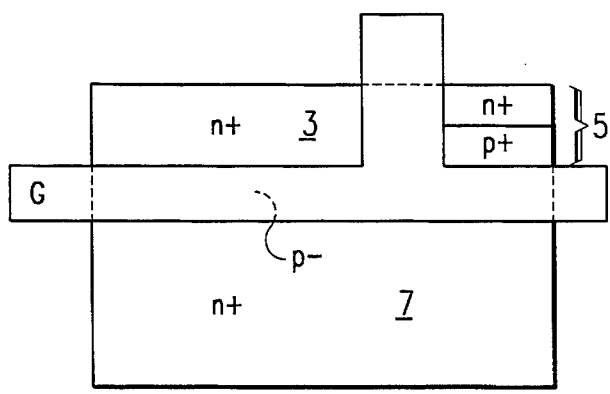
FIG. 3 illustrates a top view of the circuit of FIG. 2 fabricated as an integrated circuit.

Referring of FIGS. 2 and 3, a highly n-type doped region 3 serves as a drain/source region for transistor 2, a drain/source region for transistor 6 and a collector for bipolar parasitic transistor 4. In the circuit of FIG. 2, highly n-type doped region 3 is connected to the desired drain voltage (label D ). Another highly n-type doped region 7 serves as a second drain/source region for transistor 2 and an emitter for bipolar parasitic transistor 4. In the circuit of FIG. 2, highly n-type doped region 7 is connected to a source voltage (label S). A common gate G is used for both transistors 2 and 6. Gate G typically comprises polycrystalline semiconductor material (poly). The region under gate G comprises a lightly doped p-type semiconductor region p– and serves as the body node of transistor 2 and the base of bipolar parasitic transistor 4. Drain/source connection 5 comprises a highly doped n-type region, n+, abutting a highly doped p-type region, p+. The n-type region n+, of connection 5 serves as a second drain/source of transistor 6. The p+ region is used to make connection to the p– region under gate G which serves as the base of transistor 4. The n+ and p+ regions at connection 5 are connected together and covered with silicide in order to ensure a good electrical connection between these regions so that a drain/source of transistor 6 is connected to the base of transistor 4. Alternatively, a metal-0 level could be used to make this connection. When gate G is at a logic high level, both transistors 2 and 6 are turned "on". Thus, the drain voltage (label D) is supplied through transistor 6 and connection 5 to the base of transistor 4. Note that although the voltage at the gate has been expressed in logic terminology it is sufficient for the voltage at the gate to be at a voltage level sufficient to turn transistors 2 and 6 on. The body of transistor 2 is left floating when the gate of transistor 2 is at a logic low level. This floating of the body potential when the gate of transistor 2 is at a low logic level allows sufficient operation as long as the voltages at the bodies of the transistors do not reach voltage levels to the extent of turning the transistors on. Otherwise, high impedance state of transistor 2 may not be maintained and transistor 2 may inadvertently turn on.

Figure 4A:
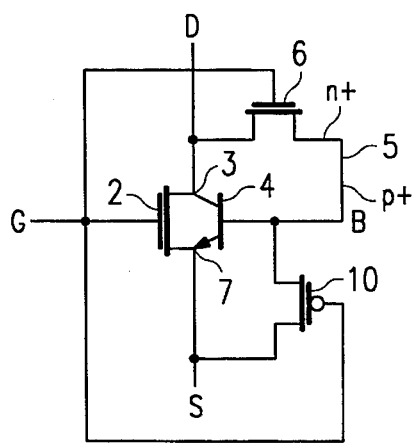
FIGS. 4a–d are schematic drawings of other preferred embodiments of the invention which allow circuit operation better suited to address problems associated with floating body transistors.

FIG. 4a–d illustrates a schematic drawing of a circuit of other preferred embodiments of the invention which allow circuit operation better suited to address the above mentioned possible problem of maintaining a high impedance state for a transistor with a floating body node. As shown in FIG. 4a, p-channel transistor 10 has been added to that which is illustrated in FIG. 2. One drain/source region of p-channel transistor 10 is connected to the base of transistor 4 (and accordingly the body of transistor 2) The other drain/source region of p-channel transistor 10 is connected to the source voltage of transistor 2. The gate of p-channel transistor 10 is connected to gate G. P-channel transistor 10 has the function of connecting the body potential to the source potential when the gate is at the low logic level.

Figure 4B:
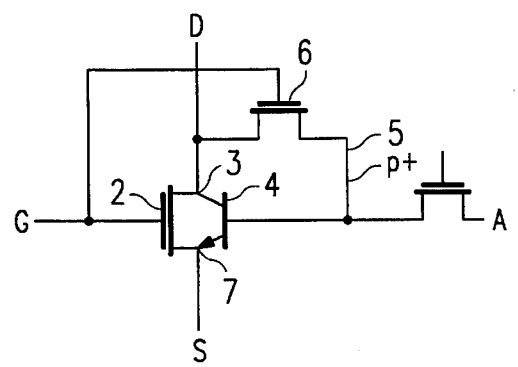
Figure 4C:
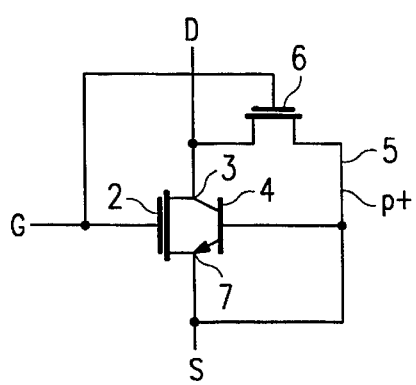
Figure 4D:
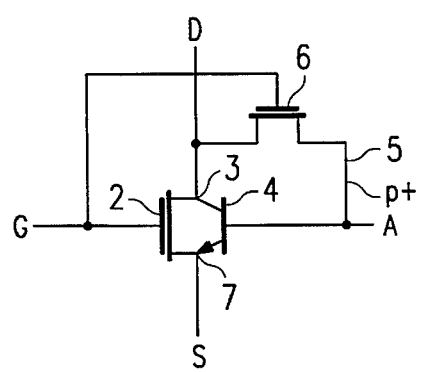

FIGS. 4b, 4c, and 4d show alternate configurations in which the body is connected to potential A through a transistor, the body is connected to the source, and the body is connected to potential A, respectively. In these cases, when the gate is low the body voltage will be controlled by the source voltage or the potential A, but when the gate voltage is high, there will be a distributed potential on the body, ranging from the source potential (or potential A) to the drain potential. Analogous configurations can be used for p-channel transistors.

In the above, potential A can be a fixed voltage, such as a supply voltage, or a variable voltage. For example, potential A may be set to ground during operation and set to a negative potential in standby.

Figure 5:
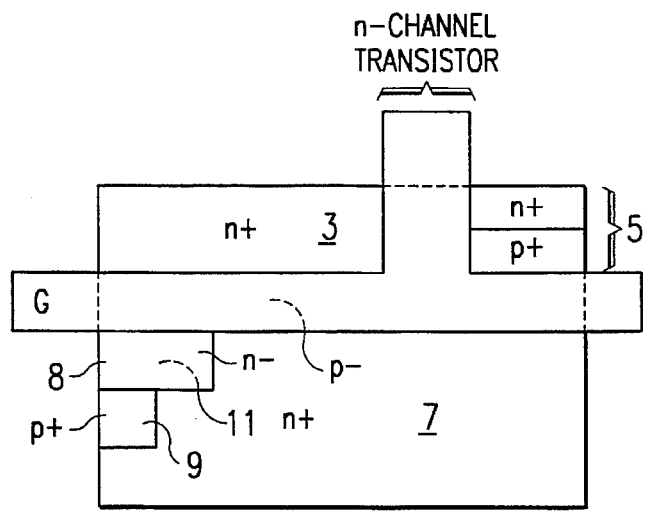

FIG. 5, which is a modification of the layout of FIG. 3, illustrates the layout of the circuit shown in FIG. 4a. Poly extension 8 along with a lightly doped n-type (n-) region 11 thereunder abutting a highly doped p-type region (p+) 9 have been added to the layout shown in FIG. 3. N+ source/drain region 7 and region 9 are connected together and covered with silicide in order to ensure a good electrical connection between these regions. Regions 7 and 9 form a drain/source region for transistor 10 shown in FIG. 4a. A second drain/source for transistor 10 is formed by the lightly doped region p− under gate G. The gate of transistor 10 is formed by poly extension 8. In operation, the circuit shown in FIG. 4a, as laid out in FIG. 5, ties the body of transistor 2 (the base of transistor 4) to the drain/source of transistor 6 at connection 5 when gates G are at a logic high level similar to the layout shown in FIG. 3. If the source/drain of transistor 6 is at a high potential by virtue of transistor 6 being turned on by gates G, this raises the body potential of transistor 2, thus increasing the conductivity of transistor 2 and the conductivity of parasitic transistor 4. However, when gates G are at a logic low level, the body of transistor 2 is tied to substantially the potential of the source of transistor 2 through the conduction of transistor 10 which is turned on by the logic low level provided by gates G. This embodiment eliminates a floating body for transistor 2 by virtue of its connecting the body to either the source or the drain.

The above description is for an n-channel transistor. An analogous configuration can be made for a p-channel transistor by interchanging n-type and p-type material, and interchanging high logic signal and low logic signal.

The foregoing discussed invention is particularly straight forward if applied to transistors which are of the semiconductor-on-insulator (SOI) type, since the individual transistor body is readily isolated for this structure. Nevertheless, the concepts of this invention are also applicable to bulk technologies. For bulk configurations with multiple transistors in a well, there can be local variation of the well potential because of the resistivity of the well material. Thus, the body contact in the above discussion can be one of multiple well contacts. The influence of one well (or body) contact on the body potential of a transistor will depend on the relative position of that well contact and the resistivity of the material forming the well. Additionally, there can be selective groupings of transistors or individual transistors in a well.

The drive current of a field effect transistor can be given a boost by its associated parasitic bipolar transistor if the body voltage is forward biased when the field effect transistor is turned on. The drive current will also be increased by a lowering of the threshold voltage when the body voltage is forward biased. Forward biasing will occur somewhat due to gate to body capacitive coupling. This effect can be enhanced by tying the gate to the body. However, there is the draw-back of gate current. The d.c. gate current can be reduced or eliminated by modulating the resistance of the gate-to-body contact with the gate voltage. This is like the smart body contact disclosed in U.S. Pat. No. 5,095,348, issued Mar. 10, 1992 and assigned to Texas Instruments, Inc. except that there the body is connected to the source or to a fixed voltage instead of to the gate voltage.

Figure 6A:
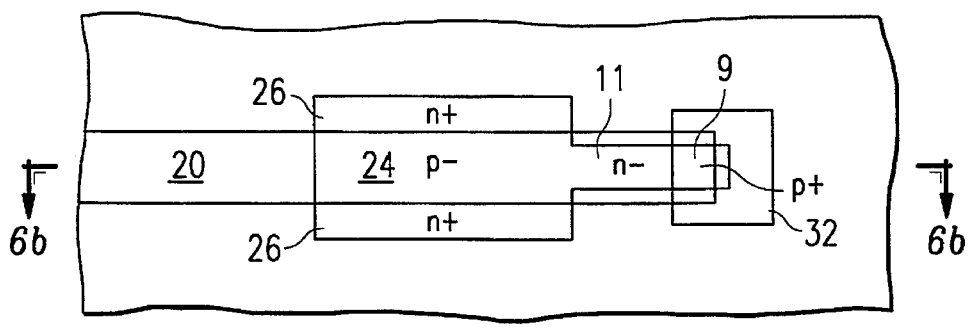
FIGS. 6a and 6b illustrate an alternative embodiment of the invention in which the gate is selectively connected to the body.
Figure 6B:
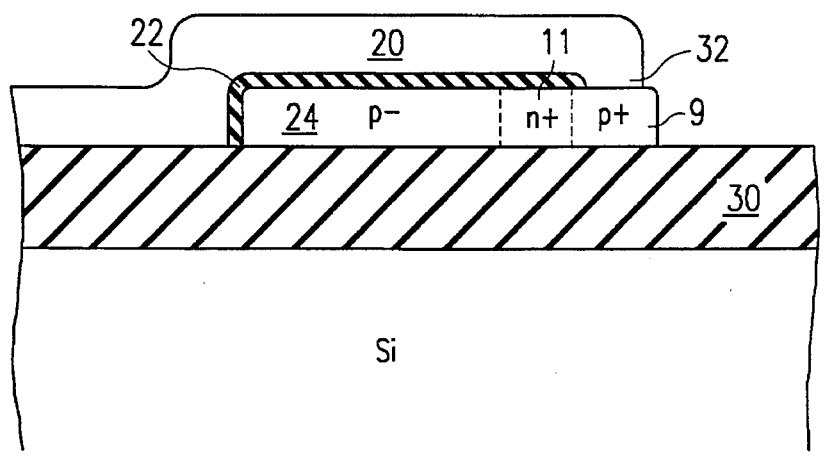

FIGS. 6a and 6b illustrate an alternative embodiment of the invention illustrated for SOI type transistors. FIG. 6a shows a top view and FIG. 6b shows a side cross-sectional view along lines A A' in FIG. 6a. FIG. 6a shows a top view of an NMOS SOI transistor. Poly gate 20 lies over a lightly doped p-type semiconductor region 24 abutted by heavily doped n-type semiconductor regions 26 serving as source/drains. The aforementioned regions 24 and 26 lie on a mesa above an insulator 30 such as SiO2 which lies over a semiconductor (shown as Si in FIG. 6b). Regions 9 and 11 serve the purpose out lined with respect to these regions in FIG. 5. Gate oxide 22 lies adjacent poly gate 20. In the illustration, a buried contact is made to region 9 from poly gate 20. Contact 32 from gate 20 to region 9 could be made by other means, such as through metallization. Accordingly, when a logic high voltage appears on gate 20, gate 20 is connected to body 24 through a field effect transistor comprising regions 9, 11, and 24. An insulator (not shown) can surround the structure shown in FIGS. 6a and 6b so as to provide isolation. While the above discussion is for an n-channel SOI field effect transistor, the invention can also be implemented for a p-channel transistor and for bulk transistors.

Although the invention has been described in detail herein with reference to its preferred embodiment and certain described alternatives, it is to be understood that this description is by way of example only, and it is not to be construed in a limiting sense. It is further understood that numerous changes in the details of the embodiments of the invention, and additional embodiments of the invention may be made by persons of ordinary skill in the art having reference to this description. It is contemplated that all such changes and additional embodiments are within the spirit and true scope of the invention as claimed below.

I claim:

1. A semiconductor device comprising a first field effect transistor and a second field effect transistor wherein:

the first field effect transistor and the second field effect transistor have a common drain, a single polysilicon line forms both the gate electrode of the second field effect transistor and the gate electrode of the first field effect transistor such that the gate electrode of the second field effect transistor is an extension of the gate electrode of the first field effect transistor, the source of the second field effect transistor is connected to a body of the first field effect transistor by a first contact, the source of the second transistor is of a first conductivity type, the body of the first transistor is of a second conductivity type, and the source of the second transistor is connected to a region of said second conductivity type.

2. The device of claim 1, further comprising a second contact to the body of said first transistor.

3. The device of claim 1, wherein the said region of said second conductivity type abuts the body of said first field effect transistor.

4. The device of claim 1, wherein the source of the second transistor is connected to said region of said second conductivity type by a silicide.

5. The device of claim 1, wherein the source of the second transistor is connected to said region of said second conductivity type by metal.

6. The device of claim 1, wherein the first and second transistors are silicon on insulator transistors.

7. The device of claim 1, wherein the first and second transistors are bulk transistors.

8. The device of claim 1 further comprising a third field effect transistor connected between said body of said first field effect transistor and a first potential.

9. The device of claim 8, wherein a gate of the third field effect transistor is an extension of the gate of the first field effect transistor and said first potential is the potential of a source of said first field effect transistor.

10. The device of claim 9, wherein:

a source of said second transistor is of a first conductivity type;

a body of said first transistor is of a second conductivity type;

the source of said second transistor is connected to a region of said second conductivity type abutting said body of said first transistor;

a source of said third transistor is of said second conductivity type and is connected to a source of said first transistor; and said body of said first transistor also forms a drain of said third transistor.

11. The device of claim 1, wherein said body of said first transistor is also connected to a first potential.

12. The device of claim 11, wherein said first potential is a potential of a source of said first transistor.

* * * * *